United States Patent
Lin et al.

(10) Patent No.: US 12,442,600 B2
(45) Date of Patent: Oct. 14, 2025

(54) THERMAL MODULE ASSEMBLING STRUCTURE

(71) Applicant: ASIA VITAL COMPONENTS CO., LTD., New Taipei (TW)

(72) Inventors: Sheng-Huang Lin, New Taipei (TW); Yuan-Yi Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 211 days.

(21) Appl. No.: 18/064,287

(22) Filed: Dec. 12, 2022

(65) Prior Publication Data

US 2023/0243595 A1    Aug. 3, 2023

(30) Foreign Application Priority Data

Jan. 28, 2022   (TW) .................................. 111103924

(51) Int. Cl.
*F28D 15/02* (2006.01)
*F28F 9/26* (2006.01)
*F28F 21/08* (2006.01)

(52) U.S. Cl.
CPC .......... *F28D 15/0275* (2013.01); *F28F 9/268* (2013.01); *F28F 21/085* (2013.01)

(58) Field of Classification Search
CPC ...... F28D 15/0275; F28F 9/268; F28F 21/085
(Continued)

(56) References Cited

U.S. PATENT DOCUMENTS 8,982,559 B2 *   3/2015   Ohsawa ............. H01L 23/3677
                                              257/713
9,429,370 B1 *   8/2016   Thomsen ........... H05K 7/20336
(Continued)

FOREIGN PATENT DOCUMENTS

CN       1332475 A       1/2002
CN     101896049 A      11/2010
(Continued)

OTHER PUBLICATIONS

Search Report dated Jun. 3, 2024 issued by China National Intellectual Property Administration for counterpart application No. 2022101039111, 2 pages.
(Continued)

*Primary Examiner* — Claire E Rojohn, III
(74) *Attorney, Agent, or Firm* — Bradley J. Thorson; DeWitt LLP

(57) ABSTRACT

A thermal module assembling structure includes an aluminum base seat which has a heat absorption side, a heat conduction side and a connection section. The connection section is selectively disposed on the heat absorption side, the heat conduction side or embedded in the aluminum base seat (between the heat absorption side and the heat conduction side). The connection section is correspondingly connected with at least one copper heat pipe. A copper embedding layer is disposed on a portion of the connection section, which portion is in contact and connection with the copper heat pipe. A welding material layer is disposed between the copper embedding layer and the copper heat pipe, whereby the aluminum base seat and the copper heat pipe can be more securely connected with each other. The conventional chemical nickel plating is replaced with the copper embedding layer so as to improve the problem of environmental pollution, etc.

4 Claims, 1 Drawing Sheet

(58) Field of Classification Search
USPC .......................................... 165/80.4, 104.21
See application file for complete search history.

(56) References Cited

U.S. PATENT DOCUMENTS

| | | | | |
|---|---|---|---|---|
| 11,758,688 | B2* | 9/2023 | Li | G06F 1/20 |
| | | | | 165/80.4 |
| 2009/0288294 | A1* | 11/2009 | Feng | F28F 1/24 |
| | | | | 29/890.032 |
| 2012/0067550 | A1* | 3/2012 | Shih | H01L 23/427 |
| | | | | 165/104.21 |
| 2012/0267068 | A1* | 10/2012 | Wu | H01L 23/427 |
| | | | | 165/80.1 |
| 2013/0048253 | A1* | 2/2013 | Yang | F28F 21/04 |
| | | | | 165/104.26 |
| 2013/0180688 | A1* | 7/2013 | Lin | B22D 19/0081 |
| | | | | 164/112 |
| 2014/0069623 | A1* | 3/2014 | Lin | F28D 15/0275 |
| | | | | 165/185 |
| 2015/0258643 | A1* | 9/2015 | Lin | B23P 15/26 |
| | | | | 29/890.03 |
| 2017/0151641 | A1* | 6/2017 | Lin | H01L 21/4882 |
| 2017/0153065 | A1 | 6/2017 | Lan | |
| 2017/0252878 | A1* | 9/2017 | Lin | B23P 15/26 |
| 2017/0254599 | A1* | 9/2017 | Lin | F28D 15/0233 |
| 2017/0302895 | A1* | 10/2017 | Okuno | G02B 7/1815 |
| 2018/0088637 | A1* | 3/2018 | Uchino | F28D 15/0275 |
| 2018/0168069 | A1* | 6/2018 | Wei | H05K 7/20336 |
| 2019/0162479 | A1* | 5/2019 | Lin | F28D 15/0233 |
| 2019/0339019 | A1* | 11/2019 | Lin | F28D 15/0233 |
| 2020/0049418 | A1* | 2/2020 | Chu | F28D 15/0275 |
| 2021/0325120 | A1* | 10/2021 | Lin | F28D 15/0266 |
| 2023/0013442 | A1* | 1/2023 | Lan | F28D 15/0233 |
| 2023/0037056 | A1* | 2/2023 | Wang | B23K 31/02 |
| 2023/0090230 | A1* | 3/2023 | Inoue | H05K 7/2039 |
| | | | | 165/80.4 |
| 2023/0241728 | A1* | 8/2023 | Lin | B23P 15/26 |
| | | | | 29/890.054 |
| 2023/0243594 | A1* | 8/2023 | Chen | F28D 15/0233 |
| | | | | 165/104.21 |
| 2023/0243595 | A1* | 8/2023 | Lin | F28F 9/268 |
| | | | | 165/104.21 |
| 2023/0243596 | A1* | 8/2023 | Lin | F28F 21/085 |
| | | | | 165/104.21 |
| 2023/0243598 | A1* | 8/2023 | Lin | F28F 21/084 |
| | | | | 165/104.26 |
| 2023/0243607 | A1* | 8/2023 | Lin | H01L 21/4882 |
| | | | | 165/104.21 |
| 2023/0243608 | A1* | 8/2023 | Lin | F28F 1/325 |
| | | | | 165/104.21 |
| 2023/0422443 | A1* | 12/2023 | Lin | F28D 15/0275 |
| 2024/0093946 | A1* | 3/2024 | Lin | H01L 23/427 |

FOREIGN PATENT DOCUMENTS

| | | | | |
|---|---|---|---|---|
| CN | 101804512 | A | | 6/2017 |
| CN | 217037775 | U | | 7/2022 |
| JP | H116057 | A | * | 1/1999 |
| TW | M245465 | U | | 10/2004 |
| TW | 201128159 | A | | 8/2011 |
| TW | 110128360 | | * | 8/2021 ............ B23K 31/02 |
| TW | M615649 | U | | 8/2021 |
| TW | M627852 | U | | 6/2022 |

OTHER PUBLICATIONS

Search Report dated Jun. 21, 2022 issued by Taiwan Intellectual Property Office for counterpart application No. 111103924.
Search Report dated Jan. 3, 2024 issued by Taiwan Intellectual Property Office for counterpart application No. 111103924.

* cited by examiner

THERMAL MODULE ASSEMBLING STRUCTURE

This application claims the priority benefit of Taiwan patent application number 111103924 filed on Jan. 28, 2022.

BACKGROUND OF THE INVENTION

1. Field of the Invention

The present invention relates generally to a thermal module assembling structure, and more particularly to a thermal module assembling structure, which can improve the problem of the conventional thermal module assembling structure that the respective heat dissipation components can be hardly welded and connected with each other.

2. Description of the Related Art

Copper has the property of high heat conductivity. Therefore, the conventional thermal module assembling structure often employs copper base seat for directly contacting a heat source to absorb the heat generated by the heat source. The copper base seat then transfers the absorbed heat to the heat pipe for speeding heat conduction and radiating fins for increasing heat dissipation area and enhancing heat dissipation efficiency. However, the thermal module employing the copper-made base seat and the copper-made heat pipe as well as the radiating fins has relatively heavy total weight. Also, the cost for the copper material is higher. Therefore, in recent years, the copper radiating fins and copper base seat have been gradually replaced with lightweight aluminum radiating fins and aluminum base seat of lower cost.

The copper material is replaced with the aluminum material to improve the problems of heavy weight and high material cost of the conventional thermal module. However, the aluminum material also has some shortcomings. For example, the surface of the aluminum is easy to oxidize to produce oxide of high melting point in the welding process. Under such circumstance, it is hard to fully fuse the metal at the welding seam. Therefore, it is difficult to weld the aluminum material.

In the case that the copper material is directly welded with the aluminum material, after welded, the directly mated sections of these two materials are apt to fissure due to fragility. In addition, when the copper material is fused and welded with the aluminum material, eutectic structures such as $CuAl_2$ are quite easy to form in the welding seam near the copper material side. The eutectic structures of $CuAl_2$, etc. are simply distributed over the grain boundaries of the material and easy to cause fatigue or fissure between the grain boundaries. Moreover, the melting point temperature and eutectic temperature of copper and aluminum are greatly different from each other. Therefore, in the welding operation, when aluminum is molten, the copper still keeps in solid state. When copper is molten, too much aluminum has been molten so that they cannot coexist in a co-fused or eutectic state. This increases difficulty in welding. Furthermore, pores are easy to produce at the welding seam. This is because the copper and aluminum both have very good heat conductivity. When welded, the metal in the molten pool will quickly crystallize. As a result, the metallurgy reaction gas at high temperature cannot escape in time so that pores are easy to produce. Accordingly, copper material and aluminum material cannot be directly welded with each other. It is necessary to first modify the surface of the aluminum material for successive welding operation with the copper material or other materials. In order to improve the above shortcoming that the copper material is placed with the aluminum material, while the aluminum material cannot be directly welded with the copper material or other heterogeneous material, those who are skilled in this field employ electroless nickel plating as a technique for modifying the surface of the aluminum material. The electroless nickel plating can be classified into three types: low phosphorus, middle phosphorus and high phosphorus. The electroless deposition is also termed "chemical deposition" or "autocatalytic plating". The electroless nickel plating solution can be classified into the following three types: (1) activate/sensitize+acidic plating bath, pertaining to acidic plating solution with a pH value within 4~6. The property of such acidic plating solution is that the loss of composition amount due to the evaporation amount is less. The operation temperature is higher, but the plating solution is relatively safe and easy to control. The plating solution has high phosphorus content and high plating ratio and is often used in industrial field. (2) activate/sensitize+alkaline plating bath, pertaining to alkaline plating solution with a pH value within 8~10. The ammonia for adjusting pH value is easy to volatilize so that in operation, it is necessary supplement ammonia at proper time so as to keep the pH value stable. The plating solution has less phosphorus content and is relatively unstable and the operation temperature of the plating solution is lower. (3) HPM+alkaline plating bath. HPM is such that the silicon crystal is soaked in a mixture solution of DI-water:$H_2O_2$(aq):HCl(aq)=4:1:1. The oxidized layer formed on the surface of the silicon crystal substitutes for the activate/sensitize to form an autocatalytic surface on the surface.

It is necessary to use a great amount of chemical reaction liquid in the electroless nickel plating process. In addition, after the electroless nickel plating process, a great amount of industrial waste liquid containing heavy metal or chemical material will be produced. Such industrial waste liquid will produce a great amount of waste water containing toxic material such as yellow phosphorus. The waste water cannot be repeatedly used and must be recovered and treated through a dedicated unit. The waste water cannot be directly discharged so as to avoid environmental pollution. The yellow phosphorus waste water contains yellow phosphorus of a concentration ranging from 50 mg/L to 390 mg/L. Yellow phosphorus is a hypertoxic material and is greatly harmful to the organs of human body, such as the liver. After a long period of drinking water containing yellow phosphorus, a human will suffer from the lesions of osteoporosis, necrosis of mandibular bone, etc. Therefore, currently, all countries have started to prohibit such manufacturing process and promoted non-toxic manufacturing process so as to protect the environment.

It is therefore tried by the applicant to provide a thermal module assembling structure, in which the total weight is reduced and the chemical nickel plating is replaced with copper embedding layer as a surface modifying method for improving the problem of the conventional thermal module assembling structure that the aluminum material cannot be directly welded with other heterogeneous material. Also, the thermal module of the present invention can facilitate the welding operation without additionally producing any pollutant to pollute the environment.

SUMMARY OF THE INVENTION

It is therefore a primary object of the present invention to provide a thermal module assembling structure, in which the chemical nickel plating is replaced with copper embedding layer to improve the problem of the conventional thermal module that the aluminum-made heat dissipation component cannot be directly welded with other heterogeneous material-made heat dissipation component.

To achieve the above and other objects, the thermal module assembling structure of the present invention includes an aluminum base seat.

The aluminum base seat has a heat absorption side, a heat conduction side and a connection section. The connection section is selectively disposed on the heat absorption side or the heat conduction side or deep embedded (inlaid) in the aluminum base seat (between the heat absorption side and the heat conduction side). The connection section is correspondingly connected with at least one copper heat pipe. A copper embedding layer is disposed on a portion of the connection section, which portion is in contact and connection with the copper heat pipe. A welding material layer is disposed between the copper embedding layer and the copper heat pipe, whereby the aluminum base seat and the copper heat pipe can be more securely connected with each other.

The present invention employs the copper embedding layer instead of chemical nickel plating. The copper embedding layer is disposed on the surface of a section of the aluminum-made heat dissipation component, which section is to be connected with the other component. When the aluminum-made heat dissipation component is desired to be welded with other heterogeneous material-made heat dissipation component, the copper embedding layer improves the problem that the aluminum-made heat dissipation component can be hardly welded. The conventional chemical nickel coating is replaced with copper embedding layer so that the problem caused by the chemical nickel plating can be improved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
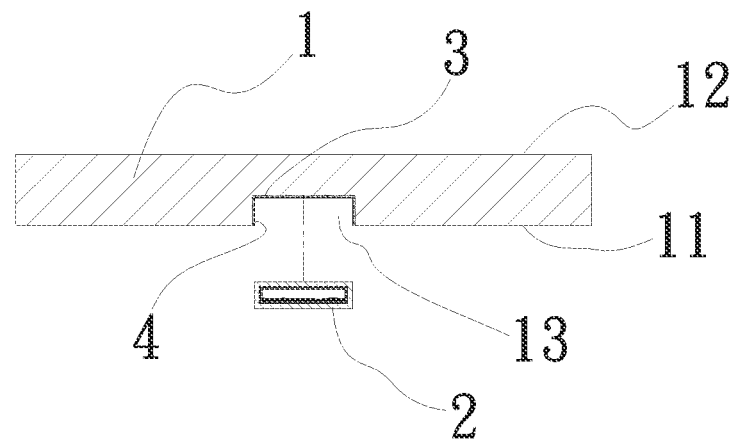
FIG. 1 is a sectional exploded view of a first embodiment of the thermal module assembling structure of the present invention.
Figure 2:
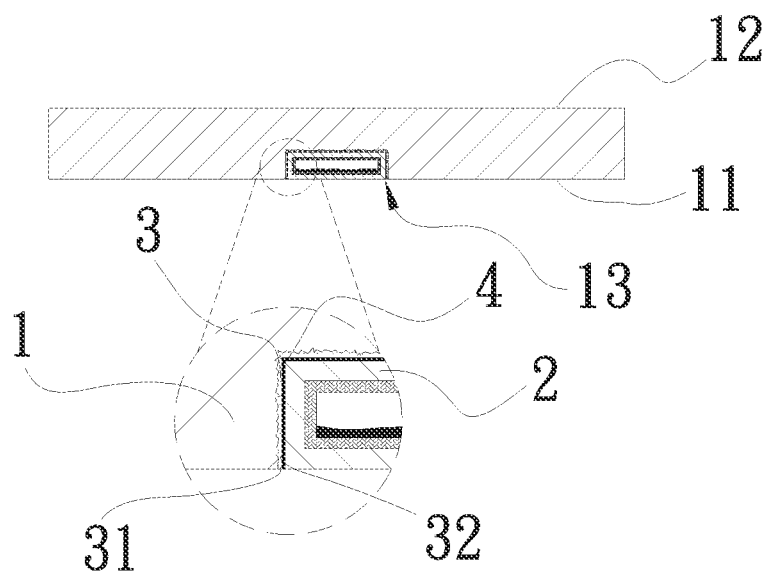
FIG. 2 is a sectional assembled view of the first embodiment of the thermal module assembling structure of the present invention.

Please refer to FIGS. 1 and 2. FIG. 1 is a sectional exploded view of a first embodiment of the thermal module assembling structure of the present invention. FIG. 2 is a sectional assembled view of the first embodiment of the thermal module assembling structure of the present invention. As shown in the drawings, the thermal module assembling structure of the present invention includes an aluminum base seat 1.

The aluminum base seat 1 has a heat absorption side 11, a heat conduction side 12 and a connection section 13. The connection section 13 is selectively disposed on the heat absorption side 11 or the heat conduction side 12 or deep embedded (inlaid) in the aluminum base seat 1 (between the heat absorption side 11 and the heat conduction side 12). The connection section 13 is correspondingly connected with at least one copper heat pipe 2. A copper embedding layer 3 is disposed on a portion of the connection section 13, which portion is in contact and connection with the copper heat pipe 2, whereby the aluminum base seat 1 can be directly welded with the copper heat pipe 2. Alternatively, a welding material layer 4 is additionally disposed between the copper embedding layer 3 and the copper heat pipe 2 for enhancing the connection strength between the aluminum base seat 1 and the copper heat pipe 2, whereby the aluminum base seat 1 and the copper heat pipe 2 can be more securely connected with each other.

The copper embedding layer 3 has an embedding face 31 and a contact face 32 (for welding and connection) respectively positioned on two opposite faces of the copper embedding layer 3. The embedding face 31 is deep inlaid in the connection section 13, (that is, the embedding face 31 is tightly bonded with or engaged with the connection section 13). The contact face 42 serves as an exposed surface of the copper embedding layer 3 and is connected with the welding material layer 4.

In this embodiment, the connection section 13 is a channel disposed on the heat absorption side 11. The copper embedding layer 3 is disposed in the channel in a position where the copper heat pipe 2 is disposed. The copper embedding layer 3 serves to enhance the welding connection strength between the copper heat pipe 2 and the aluminum base seat 1. The copper heat pipe 2 is in direct contact with a corresponding heat source (not shown) to absorb the heat generated by the heat source.

The copper embedding layer 3 is disposed on a portion of the aluminum base seat 1, which is correspondingly connected with the copper heat pipe 2 by means of high-speed spraying, printing, electroplating or mechanical processing. The copper embedding layer 3 is a copper sheet, a copper foil, copper powders or liquid copper attached to the connection section 13 by means of mechanical processing (such as high-pressure intrusion) or surface treatment process (such as spraying, electroplating or printing). In addition, when the copper embedding layer 3 is attached to and formed on the connection section 13, a part of the copper embedding layer 3 is directly engaged or implanted or inlaid in the connection section 13 to form the embedding face 31. Accordingly, not only the copper embedding layer 3 is attached to the connection section 13, but also the embedding face 31 is engaged or implanted or inlaid in the connection section 13 to serve as a foundation of the copper embedding layer 3 for enhancing the connection strength between the copper embedding layer 3 and the connection section 13. Accordingly, the copper embedding layer 3 is prevented from being peeled or detached from the connection section 13.

The copper heat pipe 2 has a heat absorption section and a condensation section. The heat absorption section is correspondingly assembled with the connection section 13 of the aluminum base seat 1. The condensation section is disposed at one end distal from the heat absorption section and is selectively assembled with other heat dissipation component or heat conduction component. By means of remote end heat dissipation, the heat is conducted to other heat dissipation component or heat conduction component.

Alternatively, the connection section 13 can be in the form of a perforation. The perforation horizontally extends to pass through two lateral sides of the aluminum base seat 1. That is, the perforation is deep embedded (inlaid) in the aluminum base seat 1 and positioned between the heat absorption side 11 and the heat conduction side 12. The copper heat pipe 2 is fitted in the perforation and connected with the aluminum base seat 1. Similarly, the copper heat pipe 2 is correspondingly connected with the connection section 13 of the aluminum base seat 1. The copper embedding layer 3 is also disposed on the surface of the perforation. The welding material layer 4 is disposed between the copper embedding layer 3 and the copper heat pipe 2, whereby the aluminum base seat 1 and the copper heat pipe 2 can be more securely connected with each other.

Alternatively, the connection section 13 is a channel disposed on the heat conduction side 12. Also, the copper embedding layer 3 is disposed on the surface of the connection section 13. The copper heat pipe 2 is correspondingly disposed in the connection section 13. The welding material layer 4 is disposed between the copper embedding layer 3 and the copper heat pipe 2, whereby the aluminum base seat 1 and the copper heat pipe 2 can be more securely assembled with each other. A radiating fin assembly can be further correspondingly disposed on the heat conduction side 12 of the aluminum base seat 1. The radiating fin assembly is made of aluminum material. The copper embedding layer 3 is disposed on all of a portion of the radiating fin assembly, which portion is correspondingly connected with the copper heat pipe 2 and a portion of the heat conduction side 12, which portion is correspondingly assembled with the radiating fin assembly and a portion of the connection section 13 of the aluminum base seat 1, which portion is correspondingly assembled with the copper heat pipe 2. In addition, by means of the welding material layer 4, the radiating fin assembly, the copper heat pipe 2 and the aluminum base seat 1 can be more securely welded and connected with each other.

In conclusion, by means of the thermal module assembling structure of the present invention, the shortcoming of the conventional thermal module employing chemical nickel plating can be improved. By means of the copper embedding layer, the copper heat pipe, the aluminum radiating fin assembly and the aluminum base seat can be successfully welded and connected with each other. In the present invention, the chemical nickel plating is replaced with the copper embedding layer so as to improve the shortcoming of environmental pollution due to chemical nickel plating and improve other shortcomings of the conventional thermal module.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A thermal module assembling structure comprising:
an aluminum base seat having a heat absorption side, a heat conduction side and a connection section, the connection section being disposed on the heat absorption side, the connection section being correspondingly connected with at least one copper heat pipe, a copper embedding layer being disposed on a portion of the connection section, the copper embedding layer being a copper sheet or copper foil, the portion of the connection section being in contact and connection with the copper heat pipe, whereby the aluminum base seat can be directly welded with the copper heat pipe, wherein the copper embedding layer has an embedding face and a contact face respectively positioned on two opposite faces of the copper embedding layer, the embedding face being deeply engaged and inlaid in the connection section so as to make the embedding face form an uneven surface, wherein the contact face is capable of being directly used for welding.

2. The thermal module assembling structure as claimed in claim 1, wherein the copper heat pipe has a heat absorption section and a condensation section, the heat absorption section being correspondingly assembled with the connection section of the aluminum base seat, the condensation section being disposed at one end distal from the heat absorption section and selectively connectable with a heat dissipation component or a heat conduction component, whereby by means of remote end heat dissipation, heat is conducted to the heat dissipation component or the heat conduction component.

3. The thermal module assembling structure as claimed in claim 1, wherein the connection section is a channel disposed on the heat absorption side.

4. The thermal module assembling structure as claimed in claim 1, wherein the contact face serving as an exposed surface of the copper embedding layer, a welding material layer being disposed between the copper embedding layer and copper heat pipe, the exposed surface of the copper embedding layer being connected with the welding material layer, whereby the aluminum base seat is securely connected with the copper heat pipe.

\* \* \* \* \*